(12) United States Patent
Feist et al.

(10) Patent No.: US 8,619,935 B2
(45) Date of Patent: Dec. 31, 2013

(54) METHODS AND STRUCTURE FOR ON-CHIP CLOCK JITTER TESTING AND ANALYSIS

(75) Inventors: Douglas J. Feist, Fort Collins, CO (US); Tracy J. Feist, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 472 days.

(21) Appl. No.: 12/912,513

(22) Filed: Oct. 26, 2010

(65) Prior Publication Data
US 2012/0098571 A1   Apr. 26, 2012

(51) Int. Cl.
H04L 7/00   (2006.01)
H03L 7/06   (2006.01)
G06F 1/04   (2006.01)

(52) U.S. Cl.
USPC ............................ 375/371; 327/158; 713/503

(58) Field of Classification Search
USPC .......................................... 375/371; 327/158
See application file for complete search history.

(56) References Cited

U.S. PATENT DOCUMENTS

| | | | |
|---|---|---|---|
| 5,663,991 A * | 9/1997 | Kelkar et al. | 375/376 |
| 6,735,710 B1 * | 5/2004 | Yoshikawa | 713/500 |
| 6,757,054 B2 * | 6/2004 | Watanabe et al. | 356/5.1 |
| 2003/0179027 A1 * | 9/2003 | Kizer et al. | 327/158 |
| 2003/0197498 A1 * | 10/2003 | Watanabe et al. | 324/76.35 |
| 2004/0064750 A1 * | 4/2004 | Conway | 713/401 |
| 2004/0088594 A1 * | 5/2004 | Canagasaby et al. | 713/400 |
| 2004/0190544 A1 * | 9/2004 | Azenko et al. | 370/442 |
| 2005/0058234 A1 * | 3/2005 | Stojanovic | 375/371 |
| 2005/0069031 A1 * | 3/2005 | Sunter et al. | 375/224 |
| 2006/0041773 A1 * | 2/2006 | Otomo | 713/503 |

OTHER PUBLICATIONS

Sunter et al., "Purely Digital BIST for any PLL or DLL," 12th IEEE European Test Symposium (ETS'07) 0/7695-2827-9/07, © 2007 IEEE.
Xia et al., "On-Chip Jitter Measurement for Phase Locked Loops," Proceedings of the 17th IEEE International Symposium on Defect and Fault Tolerance in VLSI Systems (DFT'02) 1063-6722/02, 2002 IEEE.
Sliech, "A Digital BIST for Phase-Locked Loops," IEEE International Symposium on Defect and Fault Tolerance of VLSI Systems, 1550-5774/08, 2008 IEEE DOI 10.1109/DFT.2008.62.

* cited by examiner

Primary Examiner — Leon-Viet Nguyen
Assistant Examiner — Sarah Hassan
(74) Attorney, Agent, or Firm — Duft Bornsen & Fettig (57) ABSTRACT

Methods and structure for on-chip self-test of clock jitter for an application clock signal generated within an integrated circuit (IC). Features and aspects hereof provide for acquisition of samples of an application clock signal within the IC and counting the number of samples having a predetermined value. The count is compared to acceptable limits range values to generate a pass/fail signal of the IC use by external automated. A sample clock is generated based on the reference clock used by a Phase Locked Loop (PLL) circuit. An incremental delay is added to the sample clock pulse such that the sequence of samples "walk" through an application clock pulse waveform to sense clock jitter at various points of the waveform based on the counts. Acceptable limits range for the count at each sampled point, the incremental delay, and the number of samples at each delayed value may be user programmed.

12 Claims, 8 Drawing Sheets

METHODS AND STRUCTURE FOR ON-CHIP CLOCK JITTER TESTING AND ANALYSIS

BACKGROUND

1. Field of the Invention

The invention relates generally to on-chip testing of electronic integrated circuits and more specifically relates to on-chip test and analysis of clock jitter in a circuit design.

2. Discussion of Related Art

Most digital electronic circuits utilize one or more clock signals to cycle associated digital logic through logic steps in a synchronized manner. A clock signal generally approximates a square waveform and has a fixed clock frequency as required for the particular application. The rising and/or falling edge of the square waveform of each clock period is used to sequence digital logic circuits coupled to the clock signal output to a next state.

It is common in the industry to use Phase Locked Loop (PLL) circuits to generate a clock signal for particular applications in an integrated circuit (IC). The PLL circuit generates a clock signal based on the frequency and phase of applied reference clock signals. In practice, the period of each clock signal pulse may vary within a tolerable time range. Clock jitter is defined as the unwanted variation of a clock period over time. With many present day electronic applications requiring clock frequencies in the hundred's of megahertz to multiple gigahertz range, clock jitter can have a detrimental effect on circuit timing if too excessive. Digital designers attempt to design application circuits to account for an expected range of clock jitter. However, even careful designers may encounter problems in the implementation of their circuit designs if the tight tolerances required for high-speed circuit applications are not met. Therefore, in addition to simulation of circuit designs to test for compliance with required clock signal tolerance, produced circuits (i.e., manufactured or fabricated circuits) are tested to assure compliance with the required clock signal timing tolerance.

Current test methodologies generally require specialized Automated Test Equipment (ATE) to measure clock jitter for production test purposes—especially for PLL generated clock signals. Since only specific ATE platforms have this capability, fabricated electronic circuit products must be placed on a limited and more expensive platform to perform this task. In addition, test time for this jitter testing is large enough to increase test cost and thus decrease overall profit margins for the circuit manufacturer.

Some prior techniques have attempted to resolve this problem by providing "on-chip" test capabilities as a part of the circuit design. However, present on-chip clock jitter test features modify the PLL design by "tapping" signals internal to the PLL circuit (e.g., tapping the "up" and "down" control signals within the PLL circuit per se). Such modifications to PLL circuits create problems for designs using standard cell and component libraries because the standard PLL circuits of the library may not be usable with the jitter test circuits that require "tapping" of signals within the PLL. In other words, the internal signal paths of the PLL library cell may not be exposed in a manner that permits the designer to couple external automated test equipment to the PLL internal signals. Other prior solutions are complex and require additional clock sources that may not be available in the IC design.

Thus, it is an ongoing challenge to thoroughly and cost-effectively test for clock jitter in electronic integrated circuit designs.

SUMMARY

The present invention solves the above and other problems, thereby advancing the state of the useful arts, by providing methods and structure for on-chip self-test of clock jitter for an application clock signal generated within an integrated circuit (IC). Features and aspects hereof provide for acquisition of samples of an application clock signal within the IC and provide for counting the number of samples having a predetermined value. The count is compared to acceptable limits range values to determine test results. A pass/fail signal is generated and output by the IC for use by external automated test equipment. Thus, the clock jitter self-test obviates the need of prior techniques for external automated test equipment to probe signals within the IC package to check for clock jitter. A sample clock is generated based on the reference clock used by a Phase Locked Loop (PLL) circuit. An incremental delay is added to each successive sample clock pulse such that the sequence of samples "walk" through an application clock pulse waveform to sense clock jitter at various points of the waveform based on the counts. An acceptable limits range for the count at each sampled point and the incremental delay may be user programmed.

In one aspect hereof, an integrated circuit (IC) is provided. The IC comprises a Phase Locked Loop circuit (PLL) having an input coupled to receive a reference clock signal and adapted to generate and output an application clock signal. The IC further comprises a sampling control circuit having an input coupled to receive the reference clock signal and having an input coupled to receive the application clock signal. The sampling control circuit is adapted to acquire a plurality of samples of the application clock signal. The plurality of samples span a period of time that comprises multiple clock periods of the application clock signal and are acquired based on the reference clock signal. The samples are offset in time relative to one another to sample different points of the multiple clock periods of the application clock signal. The sampling control circuit is further adapted to generate and output a count of the number of samples of the plurality of samples having a predetermined value. The IC further comprises an analysis circuit having an input coupled to receive the count. The analysis circuit is adapted to determine whether the count is within acceptable limits and further adapted to generate a pass/fail output signal indicating whether the count is within the acceptable limits.

Another aspect hereof provides a method operable within an integrated circuit (IC) for testing and analyzing jitter of a Phase Locked Loop (PLL) generated application clock signal within the IC. The method comprises generating a sample clock signal based on a reference clock signal used by the PLL and acquiring a plurality of samples of the application clock signal. The plurality of samples span a period of time that comprises multiple clock periods of the application clock signal and are acquired based on the reference clock signal. The samples are offset in time relative to one another to sample different points of the multiple clock periods of the application clock signal. The method further comprises generating a count of the number of samples having a predetermined value and determining whether the count is within acceptable limits. The method then generates a pass/fail output signal indicating whether the count is within the acceptable limits.

Yet another aspect hereof provides a circuit within an integrated circuit (IC) for testing jitter of an application clock signal generated within the IC. The circuit comprises a sample clock generator coupled to receive an external reference clock signal and adapted to generate a sample clock signal based on the reference clock signal. The reference clock signal is used within the IC to generate the application clock signal. The sample clock signal is generated by adding an incremental delay duration to each of a plurality of pulses of the reference clock signal received by the sample clock generator. The circuit further comprises an edge-triggered flip-flop coupled to receive the application clock signal and coupled to receive the sample clock signal. The flip-flop is adapted to latch the present value of the application clock signal responsive to each rising edge of the sample clock signal and is further adapted to output the present latched value. The circuit further comprises a counter coupled to receive the sample clock signal and coupled to receive the present latched value. The counter is adapted to increment a count value responsive detecting a logic high on the present latched value at a rising edge of the sample clock signal and is adapted to output its present count value. The circuit further comprises a comparator coupled to receive the present count value and coupled to receive the sample clock signal. The comparator is adapted to compare the present count value to an acceptable limits range at a rising edge of the sample clock signal and is adapted to output a pass/fail signal indicating whether the present count value is within the acceptable limits range or is outside the acceptable limits range.

DETAILED DESCRIPTION OF THE DRAWINGS

Figure 1:
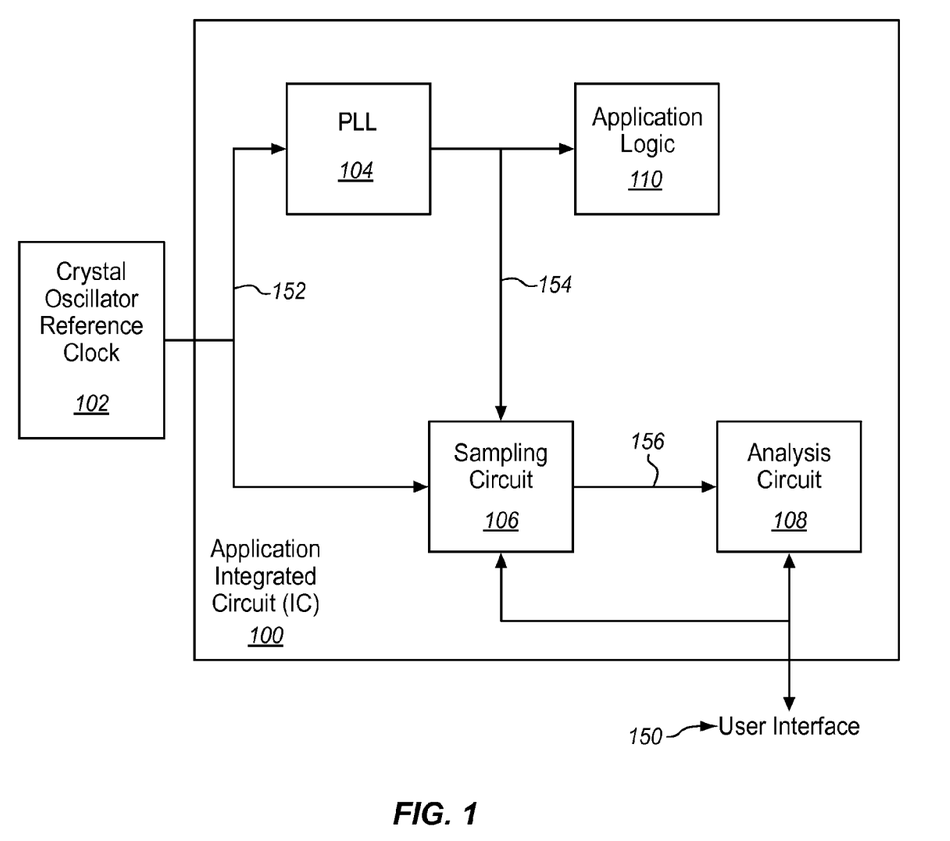
FIG. 1 is a block diagram of an IC enhanced in accordance with features and aspects hereof to provide self-test of clock jitter for an application clock signal generated within the IC.

FIG. 1 is a block diagram of an exemplary embodiment of an application integrated circuit (IC) 100 enhanced in accordance with features and aspects hereof to provide flexible testing for jitter in a clock generated within the IC 100. IC 100 may be coupled with an external crystal oscillator reference clock 102 providing a standardized clock reference signal utilized within IC 100 for generating particular clock frequencies for applications within IC 100. In some embodiments, crystal oscillator reference clock 102 may be integrated within IC 100. The reference clock signal generated by crystal oscillator reference clock 102 is applied through signal path 152 to both a Phase Locked Loop (PLL) circuit 104 and a sampling circuit 106. PLL 104 utilizes the reference clock signal on its input path 152 to generate an appropriate application clock signal on its output path 154. As is common in many digital electronic designs, the PLL output (the application clock signal) will be generated at a faster frequency than the input reference clock but will nonetheless be locked to the desired phase relationship of the reference clock.

The PLL generated application clock signal is applied via path 154 to both application logic 110 and sampling circuit 106. Application logic 110 represents any suitable logic circuits for implementing the desired application specific features of integrated circuit 100. Sampling circuit 106 (also referred to herein as "sampling control circuit" or "sampling control logic") represents suitable logic for controlling acquisition of samples of the application clock signal on its input signal path 154 and for counting the number of such samples having a predetermined value (e.g., having a logic high or logic 1 value). The count values generated by sampling control circuit 106 may be applied via path 156 to an analysis circuit 108 to determine whether the count of samples having the predetermined value are within acceptable limits for the jitter allowed on the application clock signal. Analysis circuit 108 represents suitable logic components for comparing the count values received on signal path 156 to acceptable limits range of values and for generating a pass/fail output signal applied to user interface path 150. The pass/fail signal on path 150 permits external test equipment to determine whether the application clock signal jitter is within acceptable limits without requiring access to signals within the PLL of the IC. The external test equipment (not shown) may be any suitable automated test equipment used for testing IC 100 and/or for testing a circuit board incorporating IC 100.

An external circuit (not shown) may also provide user programmed parameters via path 150 to be applied to, and utilized within sampling circuit 106 and analysis circuit 108. The user programmed parameters may include, for example, information used to determine the number of points to be sampled, information to determine the number of samples to be acquired and analyzed for each sample point, and information used to determine the acceptable limits range of values.

By contrast, with prior techniques, IC 100 does not require external automated test equipment to be coupled directly to internal logic of PLL 104 to evaluate the jitter of the application clock signal generated within PLL 104 and applied to path 154. Rather, IC 100 is enhanced in accordance with features and aspects hereof to provide self-testing of jitter on the application clock signal applied to path 154 and to generate a pass/fail signal on user interface path 150 intended for use by such external automated test equipment. Thus, the automated test for application clock signal jitter is dramatically simplified when utilizing standard external automated test equipment.

Figure 2:
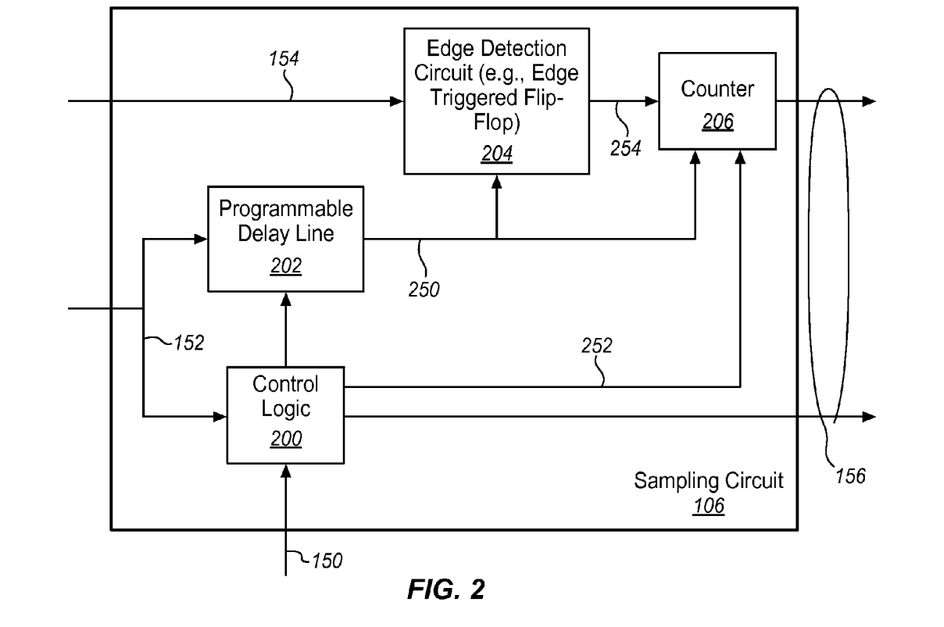
FIGS. 2 and 3 are block diagrams providing exemplary additional details of elements of the enhanced IC of FIG. 1.

FIG. 2 is a block diagram describing additional details of an exemplary embodiment of sampling circuit 106 of FIG. 1. Sampling circuit 106 is adapted to receive the reference clock signal via its input path 152 and further adapted to receive the application clock signal on its input path 154. The reference clock signal on path 152 is applied to control logic 200 and to programmable delay line 202. Control logic 200 represents any suitable logic adapted to program programmable delay line 202. Control logic 200 is further adapted to generate a reset signal applied via path 252 as an input to counter 206 discussed further herein below. Still further, control logic 200 is adapted to generate control signals applied to path 156 for use within the analysis circuit 108 discussed above and further detailed herein below.

In general, sampling circuit 106 generates a sample clock signal by applying the reference clock signal on path 152 to programmable delay line 202 programmed to add a specified delay. The delay duration is incremented for each of multiple sample points so that the sampling points used to acquire the application clock signal "walk" through a sequence of points of application clock signal pulses. Thus, at each desired sample point in time, the sample clock incorporates an incremental additional delay relative to a previous sample point in time so that the sample clock is delayed a predetermined amount of time for each acquired sample. The sample clock signal so generated as an output of programmable delay line 202 is then applied via path 250 as a clock input to edge detection circuit 204 and to counter 206. Responsive to detecting an edge of the generated sample clock signal, edge detection circuit 204 stores (e.g., acquires, latches, or otherwise captures) the present value of the application clock signal applied to its input path 154. The acquired present value of the application clock signal is then applied as an output of edge detection circuit 204 via path 254 to an input path of counter 206. Counter 206 increments its count responsive to each sample clock signal of on path 250 for each acquired present value of the application clock signal having a predetermined value (e.g., logic high or logic 1). For example, on each rising edge of the sample clock signal received by counter 206 on path 250, a logic high present value of the application clock signal received on path 254 will cause the counter 206 increment its current count value. Each logic low present value of the application clock signal on path 254 will not cause the counter 206 increment its current clock count value. The current count value generated by counter 206 is applied as an output to signal path 156 for use within analysis circuit 108 as discussed further herein below.

Control logic 200 performs the acquisition and counting functions described above for a predetermined number of samples at each sample point. Each sample acquired in response to a sample clock signal pulse latches and counts the present value of the application clock signal at a current sample point (i.e., at a currently programmed delay offset of the reference clock signal). After the desired number of samples is acquired for a given sample point, control logic adds another incremental delay to programmable delay line 202 to start acquiring application clock signals at a next sample point. The delay increment to be added for each sample point and a number of samples to be acquired at each sample point is determined by parameters of the circuit. These parameters (and other parameters) may be programmed by a user by signals applied to path 150. A smaller delay value will result in a larger number of sample points representing, in aggregate, one nominal application clock signal pulse width sampled over a number of sequential application clock signal pulses. The lower limit of the incremental delay determines the granularity of the samples acquired and counted to measure the jitter of the application clock signal. Exemplary details of such sampling are discussed further herein below with reference to FIGS. 4 through 6.

In one exemplary embodiment of sampling circuit 106, edge detection circuit 204 may be implemented utilizing a simple edge-triggered flip-flop circuit. In response to a rising edge of the sample clock applied as an input to edge-triggered flip-flop 204, the flip-flop will latch the present value of the application clock signal applied to its input path 154. This latched value is then applied as an output of flip-flop 204 via path 254 to counter 206.

Figure 3:
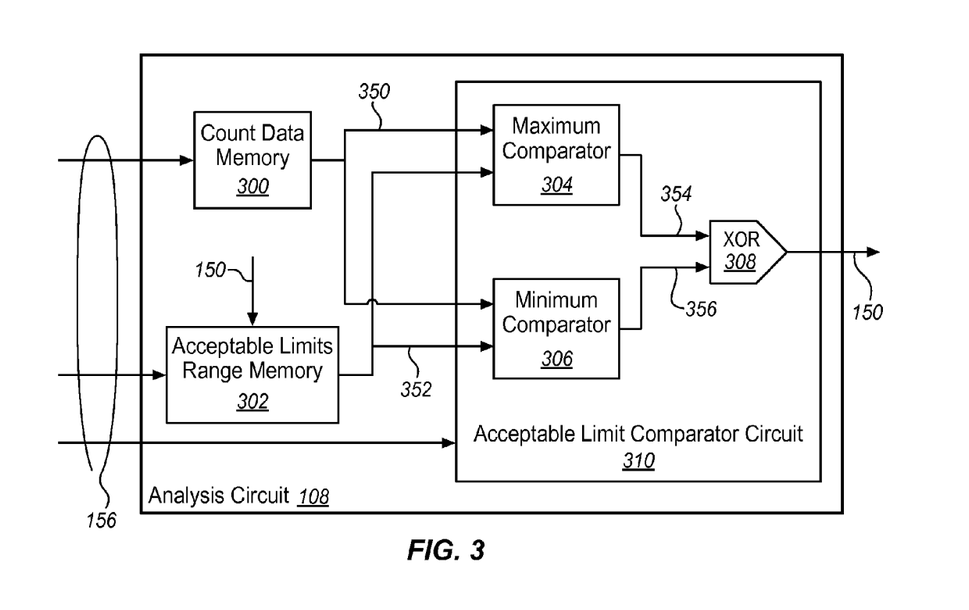

FIG. 3 is a block diagram providing additional details of an exemplary embodiment of analysis circuit 108. In the exemplary embodiment of FIG. 3, analysis circuit 108 comprises a count data memory 300 and acceptable limits range memory 302. Count data memory 300 receives the present accumulated count value from the counter of sampling circuit 106 on path 156 and receives an address value from control logic of the sampling circuit 106 indicating where the present count value should be stored in count data memory 300. Each location in count data memory 300 is adapted to store the current count value corresponding to a particular sample point in the sequence of sample points. The stored count represents the number of samples acquired at the corresponding sample point having a predetermined value. As each sample point is encountered, control logic of sampling circuit 106 increments the address applied as an input to count data memory 300 via path 156 to store the counter value in a next memory location.

In like manner, acceptable limits range memory 302 comprises a plurality of storage locations each of which stores the range (e.g., minimum and maximum values) of count values deemed to be acceptable for a corresponding sample point in the sequence of sample points that represent an application clock signal pulse. The count value stored in a presently addressed location of count data memory 300 is applied as an output via path 350 to acceptable limit comparator circuit 310. In like manner, the acceptable limits range value stored at the presently addressed location in acceptable limits range memory 302 is applied via path 352 to acceptable limit comparator circuit 310. Responsive to a control signal received from path 156, acceptable limit comparator circuit 310 compares the present count value on its input path 350 to the acceptable limits values presently applied to its input path 352. The comparison determines whether the accumulated count value corresponding to the present sample point in the sequence of sample points is within the corresponding, predefined acceptable limits range. If so, acceptable limit comparator circuit 310 generates a "pass" signal applied as an output to path 150 for use by an external automated test system. Otherwise, a "fail" signal is applied to output signal path 150 indicating that the application clock signal is outside the bounds of the acceptable limits range for clock jitter.

Acceptable limit comparator circuit 310 may comprise a maximum value comparator circuit 304 and a minimum value comparator circuit 306. The maximum comparator circuit 304 compares the present accumulated count value applied to its input path 350 with the maximum acceptable limits range value applied to its input path 352 to determine if the present cumulative count value exceeds the corresponding maximum acceptable value. If so, a logic 1 value is applied to its output path 354 as an input to XOR gate 308. Otherwise, a logic 0 value is applied as an input to XOR gate 308. In like manner, minimum comparator circuit 306 determines whether the present accumulated count value applied to its input path 350 is below the minimum acceptable value applied as an input to path 352. If so, a logic 1 value is applied to its output path 356 as an input to XOR gate 308. Otherwise, a logic 0 value is applied as an input to XOR gate 308. XOR gate 308 then generates a corresponding pass/fail signal applied to path 150 indicating that the present accumulated count value is within the minimum and maximum acceptable limits range of values or falls outside one of the acceptable limits range values.

In another exemplary embodiment, the total accumulated count of acquired samples having a predetermined value after acquiring all samples may be tested against a single minimum value and a single maximum value to determine whether the total number of samples having a predetermined value exceeds a maximum acceptable limits range value or is below a minimum acceptable range value.

In the exemplary embodiment of FIG. 3, count data memory 300 and acceptable limits range memory 302 may be any suitable memory device including, for example, static RAM or other high-speed RAM circuitry well known to those of ordinary skill in the art. The number of locations in the memories is sufficient to store the count and the corresponding range limits for each of the plurality of sample points. The size of the values to be stored is sufficient to store a value as large as the number of samples to be acquired at each of the sample points.

Those of ordinary skill in the art will readily recognize numerous additional and equivalent elements that may be present in a fully functional IC 100 as described in FIG. 1 and as further detailed in FIGS. 2 and 3. Such additional and equivalent elements are omitted herein for simplicity and brevity of this discussion.

Figure 4:
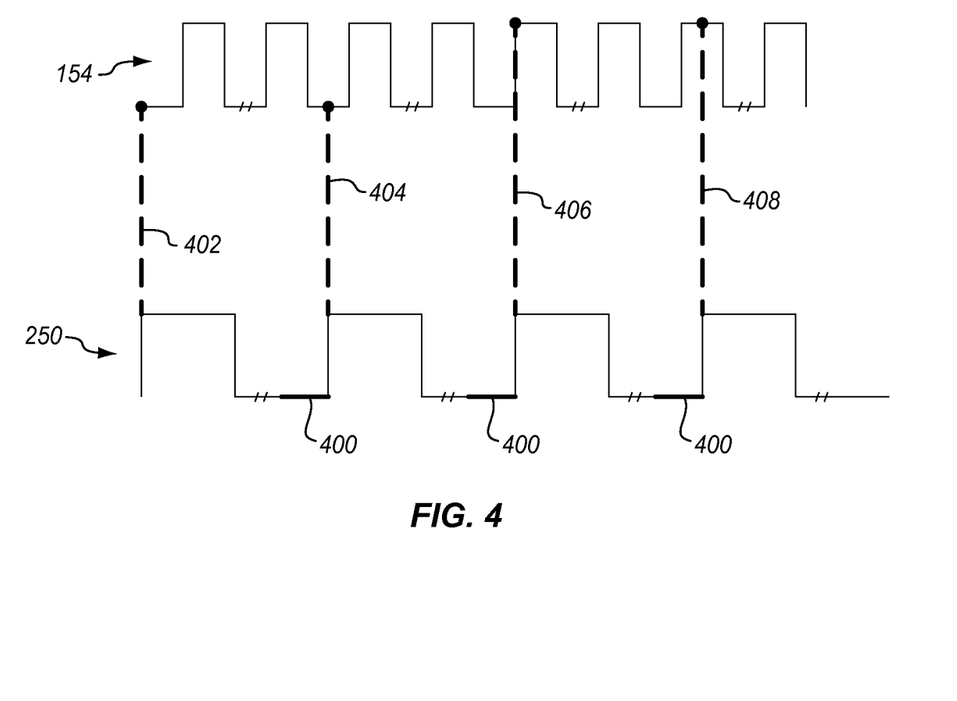
FIG. 4 is a diagram describing exemplary use of a sample clock signal in the IC used to acquire samples of the application clock signal to test for clock jitter in accordance with features and aspects hereof.

FIG. 4 is a diagram exemplifying the acquisition of samples of an application clock signal 154 by the sampling circuit 106 described above in response to each pulse of the sampling clock signal 250 generated by the sampling control logic 106. As discussed above, the sampling sample clock signal is generated based on the reference clock with an added delay from the programmable delay line. The delay added to the reference clock to generate the sample clock signal 250 is incremented for each sample point (by the sampling control logic) so that the sampled points "walk" through the application clock signal pulses. The incremental delay added to the reference clock signal is shown in FIG. 4 as bolded portions 400 of the sample clock signal 250. At each rising edge of the sample clock signal 250 (as delayed by incremental delays 400), a sample is acquired of the application clock signal 154 as indicated by bolded dashed lines extending upward from the sample clock signal diagram 250 to the application clock signal diagram 154. For example, bolded dashed line 402 indicates a first sample acquired near the start of an application clock signal 154 pulse logic 0 value. At a next rising edge of the delayed sample clock 250, bolded dashed line 404 indicates another acquired sample from another point in a pulse of the application clock signal 154 still having a logic 0 present value. In like manner, samples acquired at points indicated by bolded dashed lines 406 and 408 indicate acquired samples having a logic 1 present value of the application clock signal 154.

The particular sequence of one sample at each of four particular sample points of application clock signal 154 is intended merely as exemplary to suggest the use of the sample clock signal 250 with appropriate programmed, incremental delays 400 to acquire samples from application clock signal 154. In practice, the duration of the incremental delay 400 would be substantially smaller than the period of the application clock signal 154. Thus, a substantial number of sample points may be acquired spread over a similar number of application clock signal pulses. Further, in practice, many more than one sample would be acquired at each sample point.

Figure 5:
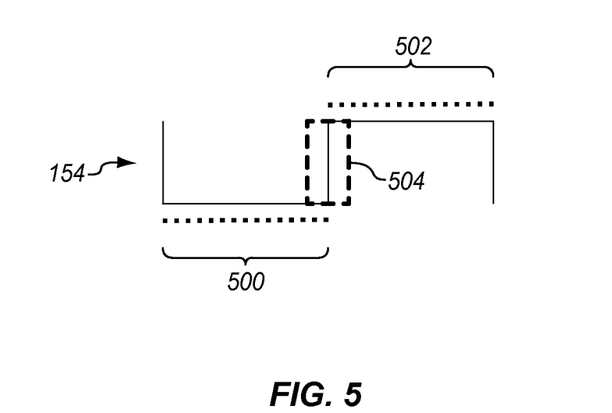
FIG. 5 is a diagram exemplifying a plurality of acquired samples of a waveform of the application clock signal under test within the IC where the sample are acquired over a span of multiple pulses of the application clock signal in accordance with features and aspects hereof.

FIG. 5 shows an exemplary application clock signal 154 waveform with a corresponding plurality of sample points 500 and 502. At each sample point a defined number of samples would be acquired—e.g., one at each of multiple sample clock rising edges using the currently programmed delay for that sample point. The dashed line box 504 indicates an area of sample points that may acquire samples during the logic 0 to logic 1 transition of the application clock signal 154. In that highlighted region 504, clock jitter may cause an inappropriate number of logic 1 values or logic 0 values to be sampled from the application clock signal pulses during the corresponding sample point. Analysis performed by the analysis circuit 108 discussed above may detect such inappropriate count values as being lower than a minimum acceptable limit or higher than a maximum acceptable limit. Thus, features and aspects described herein permit the IC to perform its own testing (self-testing) of clock jitter for an application clock signal and generate a simple output signal indicating path/fail of the clock jitter self-test. Such a simple pass/fail output signal from the IC may be easily detected by an automated test system without requiring intervention by the automated test system with the signaling generated by or within the PLL.

As shown in FIGS. 4 and 5, the samples acquired at each of the plurality of sample points span a period of time that comprises multiple clock periods of the application clock signal 154. The sample points are offset in time relative to one another (by the added incremental delays 400 of FIG. 4) to sample different points of the multiple clock periods of the application clock signal.

Figure 6A:
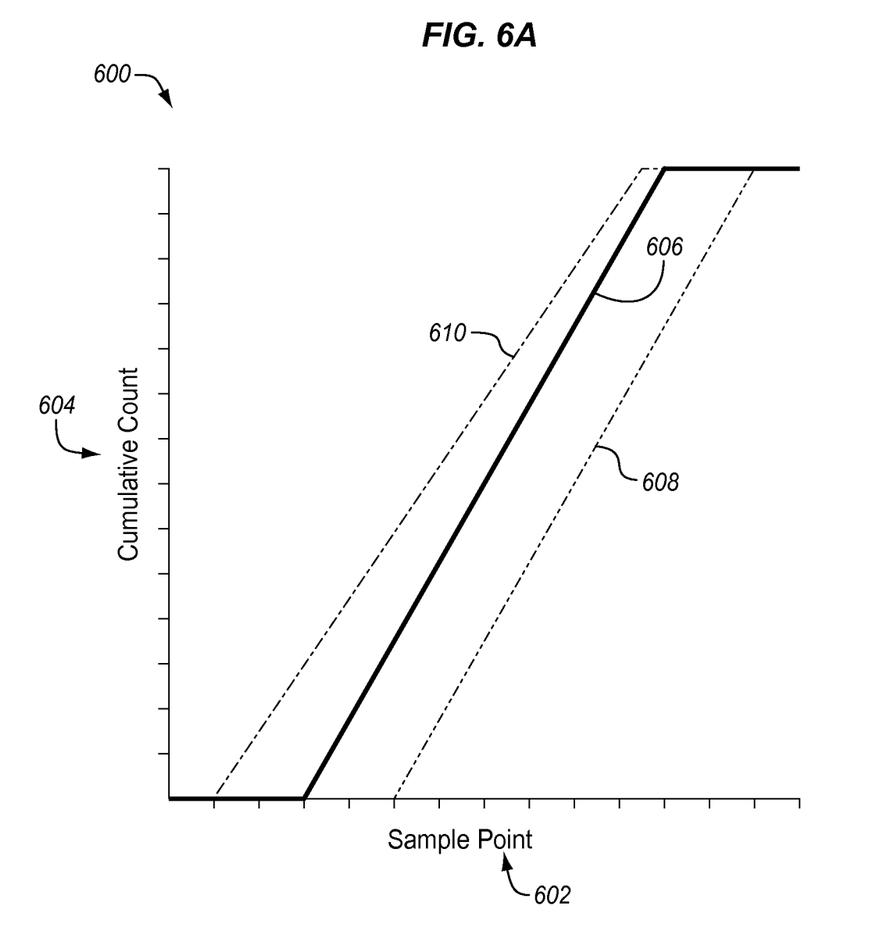
FIGS. 6A through 6C are graphs describing exemplary analytical results for detecting whether clock jitter of an application clock signal is within an acceptable limits range.
Figure 6B:
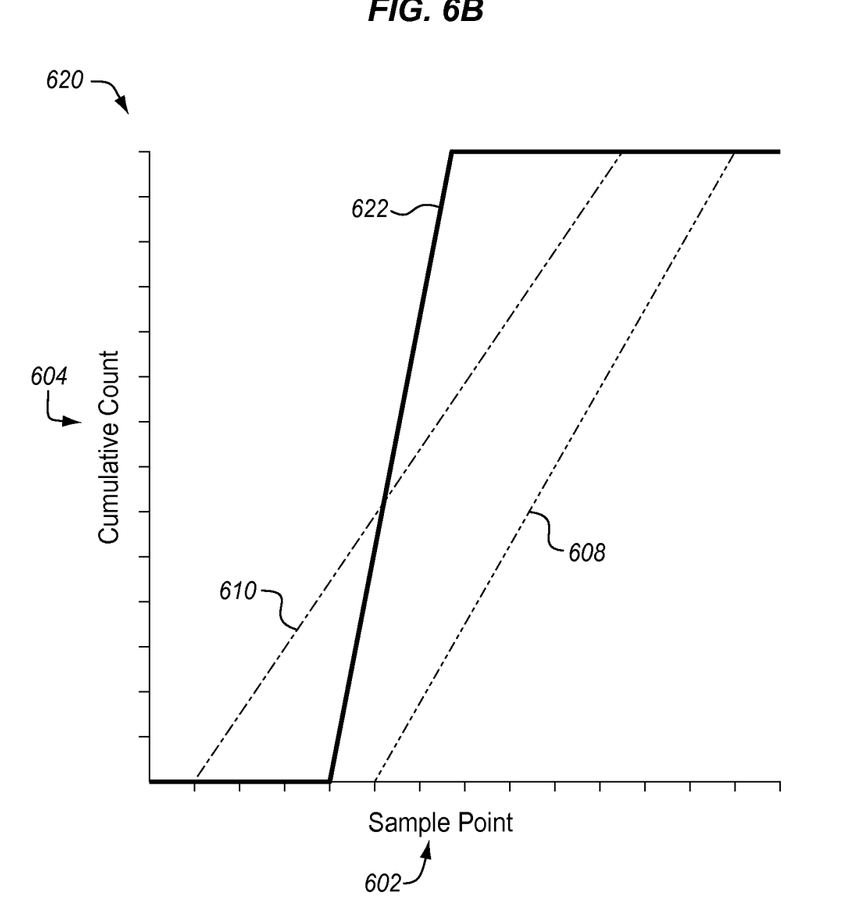
Figure 6C:
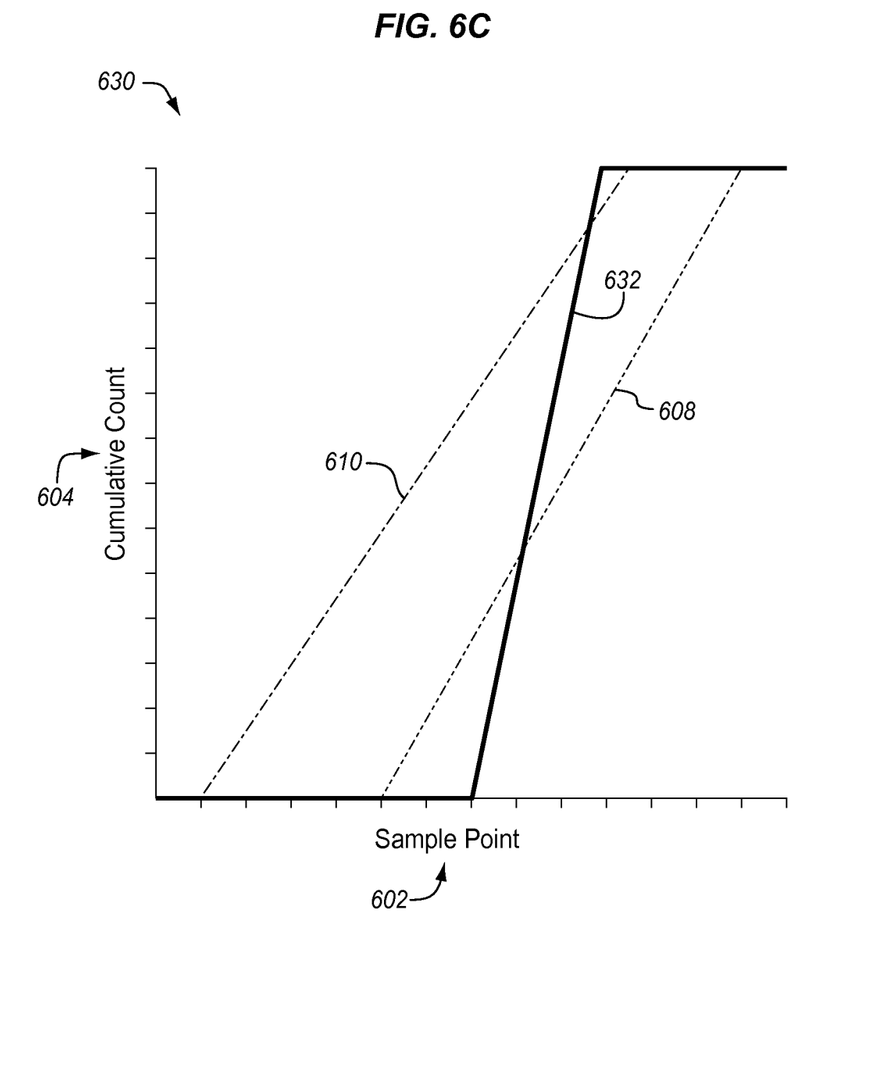

FIGS. 6A through 6C are diagrams exemplifying the jitter self-test analysis performed in accordance with features and aspects hereof. Referring first to FIG. 6A, graph 600 indicates the cumulative count of acquired samples of an application clock signal having a predetermined value (e.g., a logic 1 or logic high value) at each of multiple successive sample points. The X-axis 602 of graph 600 represents successive sample points acquired over time advancing from left to right in graph 600. The Y-axis 604 of graph 600 represents the total cumulative count of acquired samples having a predetermined value at the corresponding sample point on the X-axis. The thick line 606 represents an exemplary plot of the cumulative count on successive sample points. Dashed line 608 represents a graph of minimum acceptable values defined by an acceptable limits range for each sample point while dashed line 610 represents corresponding maximum acceptable values defined by the acceptable limits range for each sample point. Graph 600 therefore represents a successful test in which the actual cumulative count indicated by plot 606 is never less than the acceptable minimum value from the acceptable limits range for any sample point and is never greater than the maximum acceptable value of the acceptable limits range for any sample point. Graph 600 of FIG. 6A suggests a self-test of the jitter of an application clock signal that results in a "pass" signal being generated from the IC.

Those of ordinary skill in the art will readily recognize that plot 606, 608, and 610 are merely intended to suggest exemplary values to be used analyzing the accumulating count over each of the successive sequence of sample points. In practice, plot 606, 608, and 610 would be represented merely as a sequence of discrete values rather than a smooth linear function as shown.

FIG. 6B shows a similar graph 620 depicting an exemplary actual count as thick line 622 in which the actual cumulative count exceeds the maximum acceptable value of the acceptable limits range of one or more sample points (e.g., by approximately the fifth sample point shown along the X-axis). Graph 620 of FIG. 6B therefore suggests a self-test of the jitter of an application clock signal that results in a "fail" signal being generated from the IC.

FIG. 6C shows a similar graph 630 depicting an exemplary actual count as thick line 632 in which the actual cumulative count falls below the minimum acceptable value of the acceptable limits range of one or more sample points (e.g., by approximately the sixth sample point shown along the X-axis). Graph 630 of FIG. 6C therefore suggests a self-test of the jitter of an application clock signal that results in a "fail" signal being generated from the IC.

Those of ordinary skill in the art will readily recognize that FIGS. 4 through 6 are intended merely to suggest the type of analysis being performed based on acquired samples of an application clock signal. The particular number of sample points and samples acquired at each sample point, the exemplary timing relationships, the exemplary pass/fail acceptable limits range, etc. are all intended merely as exemplary of possible sample acquisition sequences and corresponding analysis.

Figure 7:
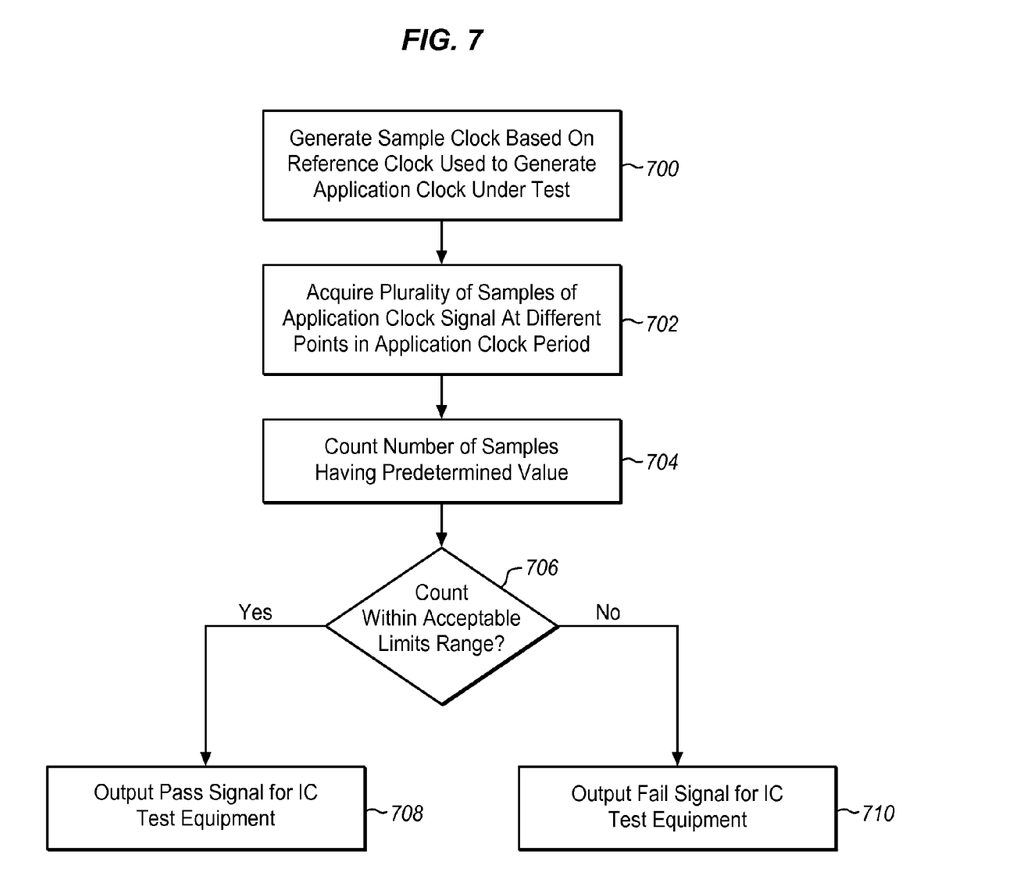
FIGS. 7 and 8 are flowcharts describing exemplary methods for clock jitter self-test of an application clock signal within an IC.

FIG. 7 is a flowchart describing an exemplary method in accordance with features and aspects hereof to provide for application clock signal jitter self-test within an integrated circuit. The method of FIG. 7 may be performed, for example, within an enhanced IC such as IC 100 of FIG. 1. More specifically, the method of FIG. 7 may be performed, for example, by sampling circuit 106 and analysis circuit 108 of FIGS. 1 through 3. At step 700, a sample clock signal is generated based on a reference clock also by a phase locked PLL circuit that generates a corresponding application clock signal to be tested. At step 702, a plurality of samples of the application clock signal are acquired. The samples are acquired at different points in an application clock pulse period based on an incremental delay added to the reference clock signal in generating the sample clock signal. At step 704, the number of samples having a predetermined value (e.g., a logic high or logic 1 value) is counted. As discussed further herein below, in one exemplary embodiment the cumulative count at each successive sampled point may be stored and compared to corresponding acceptable limits range values. In another exemplary embodiment, the total cumulative count for all sample points that, in aggregate, sample one entire pulse of the application clock signal under test may be determined. At step 706, the cumulative count is compared with an acceptable limits range of values. A minimum and maximum value of the acceptable limits range specifies a minimum count and a maximum count within which the accumulated count must remain at each sampled point. In another exemplary embodiment, the total count accumulated over all samples may be compared to a single pair of acceptable limit values (i.e., a total count minimum value and a total count maximum value). If step 706 determines that the cumulative count is within the acceptable limits range, step 708 generates and outputs a "pass" signal to be utilized by external automated test equipment. If the cumulative count of samples having a predetermined value falls outside the acceptable limits range, step 710 generates and outputs a "fail" signal from the IC to be applied to external automated test equipment indicating a failure of the application clock jitter self-test.

Figure 8:
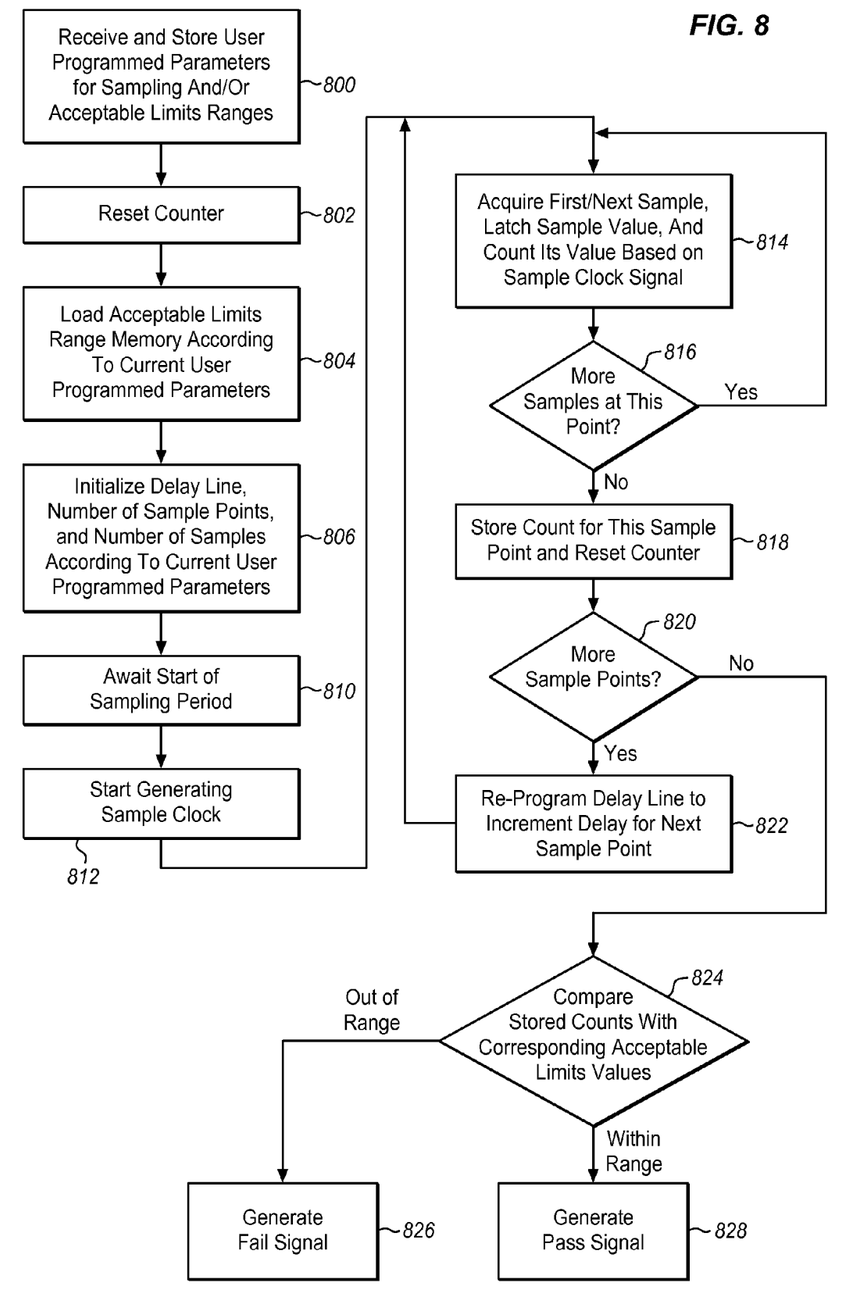

FIG. 8 is a flowchart describing another exemplary method in accordance with features and aspects hereof to provide for clock jitter self-testing of an application clock signal within an integrated circuit. The method of FIG. 8 may be performed, for example, within an enhanced IC such as IC 100 of FIG. 1. More specifically, the method of FIG. 8 may be performed, for example, by sampling circuit 106 and analysis circuit 108 of FIGS. 1 through 3. At step 800, user programmed parameters are received and stored defining parameters of the clock jitter self-test. User programmed parameters may be used to define the number of samples to be acquired at each sample point as well as the number of sample points to be used. Specifically, for example, the incremental delay time to be programmed by the sampling control circuit for each sample point may be provided as a user programmed parameter to thereby define the number of sample points to be used in performing the clock jitter self-test. Further, the number of samples to be acquired at each of the plurality of sample points may be defined by provided parameters. Other user programmed parameters may define acceptable limits ranges for the clock jitter self-test. In one exemplary embodiment the acceptable limits ranges may define a minimum and maximum accumulated count for each of the sequence of sample points. In such an embodiment, as each sample point is completed (i.e., the defined number of samples acquired using a current incremental delay amount) and the counter appropriately incremented or not incremented depending on the application clock signal samples acquired, a minimum and maximum value may be derived from the user programmed parameters for that sample point to determine whether the clock jitter test has passed or failed at that sample point. In another exemplary embodiment, the total count accumulated through all of the sequence of samples representing a single application clock signal pulse may be compared to a single pair of acceptable minimum and maximum values to determine if the total count was below an acceptable minimum or above and acceptable maximum. In still other embodiments, those of ordinary skill in the art will readily recognize that step 800 may be optionally skipped if the parameters to be used for jitter testing of an application clock signal are statically defined within the integrated circuit testing features.

At step 802, the counter component within the clock jitter testing mechanism is reset (to a zero value) by the sampling control logic. Step 804 then loads the acceptable limits range memory according to the current user programmed parameters (or as noted above according to statically defined testing parameters). At step 806, the programmable delay line is initialized according to the current user programmed parameters (or in accordance with statically defined testing parameters). As noted above, selection of the incremental delay to be programmed into the delay line may determine the number of sample points to be acquired to represent one full clock period of the application clock signal, Further, the number of samples to be acquired at each of the plurality of sample points may be determined by the user programmed parameters (or may be defined statically). Step 810 then awaits an appropriate time to start sampling the application clock signal. At step 812 begins generation of the sample clock based on the reference clock signal applied to the integrated circuit and the programmed delay in the programmable delay line.

Steps 814 through 822 or then iteratively operable until the desired number of samples at each of the desired number of sample points of the application clock signal have been acquired. At step 814, a first or next sample is acquired and stored in an appropriate memory (e.g., latched in an edge-triggered flip-flop). The sample value so acquired and stored is then used as an input to a counter also triggered by the sample clock signal. Step 816 then determines whether more samples remain to be acquired at the present sample point. If the defined number of samples has not yet been acquired, processing loops back to step 814 until all samples at the current sample point have been acquired. At step 818, the present cumulative count for the just completed sample point is stored (e.g., in a location of a count memory corresponding to the current sample point) and the counter circuit is reset to start counting acquired samples in a new sample point. Step 820 then determines whether more sample points remain to be acquired. If so, step 822 re-programs the delay line to add an incremental delay for the next sample point and processing loops back to step 814 to begin acquiring samples for the new sample point.

When samples for all sample points are acquired and counted, step 824 compares the accumulated count for each sample point (stored in locations of a count memory) with a corresponding minimum and maximum acceptable limits value corresponding to each sample point. If the cumulative count falls outside of the corresponding range of acceptable limits for any of the sample points, step 826 generates a failure signal indicating that the clock jitter testing of the application clock signal has failed. Otherwise, step 828 generates a pass signal indicating success in the clock jitter test performed within the integrated circuit for an application clock signal.

Those of ordinary skill in the art will readily recognize additional and equivalent steps that may be present in the methods of FIGS. 7 and 8. Such additional and equivalent steps are omitted herein for simplicity and brevity of this discussion.

While the invention has been illustrated and described in the drawings and foregoing description, such illustration and description is to be considered as exemplary and not restrictive in character. One embodiment of the invention and minor variants thereof have been shown and described. Protection is desired for all changes and modifications that come within the spirit of the invention. Those skilled in the art will appreciate variations of the above-described embodiments that fall within the scope of the invention. As a result, the invention is not limited to the specific examples and illustrations discussed above, but only by the following claims and their equivalents.

What is claimed is:

1. An integrated circuit (IC) comprising:
    a Phase Locked Loop circuit (PLL) having an input coupled to receive a reference clock signal and adapted to generate and output an application clock signal;
    a sampling control circuit having an input coupled to receive the reference clock signal and having an input coupled to receive the application clock signal, the sampling control circuit adapted to acquire a plurality of samples of the application clock signal at each of a plurality of sample points, wherein the plurality of sample points span a period of time that comprises multiple clock periods of the application clock signal, wherein the plurality of samples are acquired based on the reference clock signal, wherein the plurality of sample points are offset in time relative to one another to sample different points of the multiple clock periods of the application clock signal, and wherein the sampling control circuit is further adapted to generate and output a count of the number of samples of the plurality of samples having a predetermined value at each of the plurality of sample points; and
    an analysis circuit having an input coupled to receive the count, the analysis circuit adapted to determine whether the count is within acceptable limits and further adapted to generate a pass/fail output signal indicating whether the count is within the acceptable limits,
    wherein the analysis circuit further comprises a acceptable limit comparator circuit having an input coupled to receive the count and having an input coupled to receive a predetermined acceptable limits range, the comparator circuit adapted to compare the count with the acceptable limits range and further adapted to generate the pass/fail output signal indicating whether the count is within the acceptable limits range.

2. The IC of claim 1
    wherein the sampling control circuit further comprises:
    a programmable delay line circuit having an input coupled to receive the reference clock signal and adapted to generate a sample clock signal,
    wherein the sampling control circuit uses the sample clock signal to acquire each of the plurality of samples and wherein the sample clock signal is delayed a predetermined amount for each sequential sample point of the plurality of sample points.

3. The IC of claim 2
    wherein the sampling control circuit further comprises:
    an edge detection circuit having an input coupled to receive the application clock signal and having an input to receive the sample clock signal, the edge detection circuit adapted to latch the present value of the application clock signal in response to sensing an edge on the sample clock signal and is further adapted to apply the latched value of the application clock signal to an output of the edge detection circuit.

4. The IC of claim 3
    wherein the edge detection circuit further comprises an edge-triggered flip-flop having an input coupled to receive the sample clock signal and having an input coupled to receive the application clock signal and adapted to latch the value of the application clock signal responsive to each rising edge of each pulse of the sample clock signal.

5. The IC of claim 3
    wherein the sampling control circuit further comprises:
    a counter circuit having an input coupled to receive the latched present value of the application clock circuit and having an input coupled to receive the sample clock signal, wherein the counter circuit is adapted to increment a counter for each latched value having the predetermined value in response to the rising edge of each pulse of the sample clock pulse, and wherein the counter circuit is further adapted to output the count from the counter circuit.

6. The IC of claim 1 further comprising:
    a limits range memory adapted to store a plurality of acceptable limits ranges each range associated with a corresponding sample point of the plurality of sample points and further adapted to apply the acceptable limits range corresponding to a present sample point of the plurality of sample points to the comparator circuit, wherein the limits range memory is further adapted to receive the acceptable limits ranges from an external source.

7. The IC of claim 6 further comprising:
    a count data memory adapted to store the count corresponding to each sample point of the plurality of sample points and further adapted to apply the count corresponding to the present sample point to the comparator circuit.

8. A method operable within an integrated circuit (IC) for testing and analyzing jitter of a Phase Locked Loop (PLL) generated application clock signal within the IC, the method comprising:
    generating a sample clock signal based on a reference clock signal used by the PLL;
    acquiring a plurality of samples of the application clock signal at each of a plurality of sample points, wherein the plurality of sample points span a period of time that comprises multiple clock periods of the application clock signal, wherein the plurality of samples are acquired based on the reference clock signal, wherein plurality of sample points are offset in time relative to one another to sample different points of the multiple clock periods of the application clock signal;
    generating a count of the number of samples having a predetermined value;
    determining whether the count is within acceptable limits; and
    generating a pass/fail output signal indicating whether the count is within the acceptable limits,
    wherein the step of determining comprises:
    comparing the count to an acceptable limits range; and
    generating the pass/fail output signal indicating whether the count is within the acceptable limits range.

9. The method of claim 8
    wherein the step of acquiring further comprises:

programming a programmable delay line circuit in the IC to generate a sample clock signal delayed from the reference clock signal wherein the sample clock signal is delayed a predetermined amount for each sequential sample point of the plurality of sample points; and acquiring each of the plurality of samples based on the sample clock signal.

10. The method of claim 9 wherein the step of generating the count further comprises:

applying the application clock signal and the sample clock signal to an edge detection circuit of the IC to latch the present value of the application clock signal in response to sensing an edge on the sample clock signal; and applying the latched present value in the edge detection circuit and the sample clock signal to a counter circuit to count the number of latched present values of the application clock signal having the predetermined value.

11. The method of claim 9 wherein the step of generating the count further comprises:

applying the application clock signal and the sample clock signal to an edge-triggered flip-flop of the IC to latch the present value of the application clock signal in response to sensing an edge on the sample clock signal; and applying the latched present value in the edge-triggered flip-flop circuit and the sample clock signal to a counter circuit to count the number of latched present values of the application clock signal having the predetermined value.

12. The method of claim 8 further comprising:

receiving the acceptable limits range from an external source; and storing the acceptable limits range in a memory within the IC.

\* \* \* \* \*